(12) United States Patent
Morita et al.

(10) Patent No.: US 8,829,070 B2
(45) Date of Patent: Sep. 9, 2014

(54) ULTRAVIOLET-CURABLE RESIN MATERIAL FOR PATTERN TRANSFER AND MAGNETIC RECORDING MEDIUM MANUFACTURING METHOD USING THE SAME

(75) Inventors: Kazuyo Morita, Yokohama (JP); Seiji Morita, Yokohama (JP); Shinobu Sugimura, Yokohama (JP); Masatoshi Sakurai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 547 days.

(21) Appl. No.: 12/872,440

(22) Filed: Aug. 31, 2010

(65) Prior Publication Data
US 2011/0049089 A1    Mar. 3, 2011

(30) Foreign Application Priority Data
Aug. 31, 2009   (JP) ................................ 2009-200860

(51) Int. Cl.
| | | |
|---|---|---|
| *C08F 20/22* | (2006.01) | |
| *C08F 20/10* | (2006.01) | |
| *C08F 20/06* | (2006.01) | |
| *C08F 20/00* | (2006.01) | |
| *C08F 220/18* | (2006.01) | |
| *G03F 7/027* | (2006.01) | |
| *G03F 7/00* | (2006.01) | |
| *G11B 5/855* | (2006.01) | |

(52) U.S. Cl.
CPC .............. *G11B 5/855* (2013.01); *C08F 220/18* (2013.01); *G03F 7/027* (2013.01); *G03F 7/0002* (2013.01)
USPC ............................ 522/182; 522/153; 522/178

(58) Field of Classification Search
USPC ......................... 522/178, 182, 153
See application file for complete search history.

(56) References Cited

U.S. PATENT DOCUMENTS

| | | | | |
|---|---|---|---|---|
| 5,629,445 A | * | 5/1997 | Nakayama et al. | ............ 560/209 |
| 7,462,653 B2 | * | 12/2008 | Kakinuma et al. | ............ 522/100 |
| 7,868,109 B2 | | 1/2011 | Samukawa et al. | |
| 8,076,400 B2 | * | 12/2011 | Obi | ................................ 524/89 |
| 2009/0143505 A1 | | 6/2009 | Samukawa et al. | |
| 2010/0009138 A1 | * | 1/2010 | Kodama et al. | ............ 428/195.1 |

FOREIGN PATENT DOCUMENTS

| | | |
|---|---|---|
| JP | 2005-331771 | 12/2005 |
| JP | 2006-309125 | 11/2006 |
| JP | 2007-186570 | 7/2007 |
| JP | 2007-277467 A | 10/2007 |
| JP | 2008-122805 A | 5/2008 |
| JP | 2008-242377 | 10/2008 |
| WO | WO 2007/105627 A1 | 9/2007 |

OTHER PUBLICATIONS

Product Specification for 9,9'-Bis [4-(2-acryloyloxyethoxy)phenyl] fluorene from Wilshire Technologies (online). [Retrieved on line Mar. 11, 2014]. Retrieved from <URL: http://www.wilshiretechnologies.com/master_pdf/9,9-Bis[4-(2-Acryloyloxyethoxy)phenyl]fluorene,%20CAS%20161182-73-6.pdf.*
First Office Action mailed by Japan Patent Office on Apr. 3, 2012 in the corresponding Japanese Patent Application No. 2010-273319.

* cited by examiner

*Primary Examiner* — Sanza McClendon
(74) *Attorney, Agent, or Firm* — Knobbe Martens Olson & Bear LLP

(57) ABSTRACT

According to one embodiment, an ultraviolet curing curable resin material for pattern transfer is provided. The resin contains isobornyl acrylate, an acrylate having a fluorene skeleton, a polyfunctional acrylate, and a polymerization initiator.

5 Claims, 3 Drawing Sheets

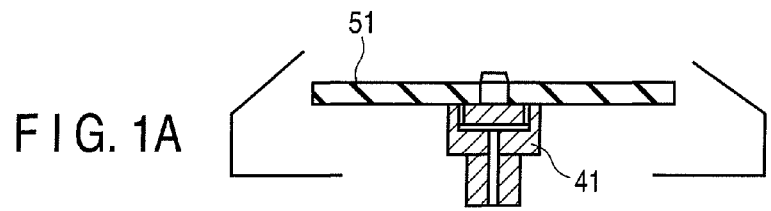
F I G. 1A
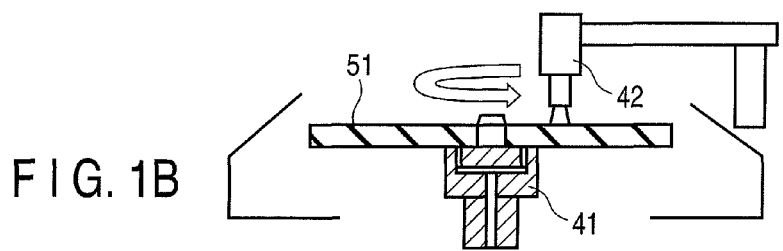
F I G. 1B
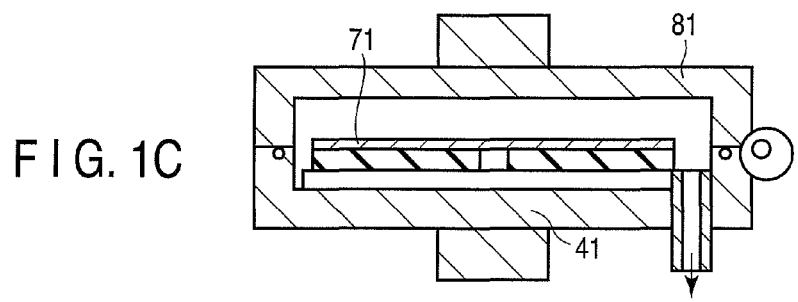
F I G. 1C
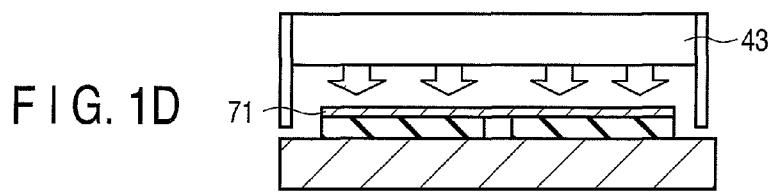
F I G. 1D

ULTRAVIOLET-CURABLE RESIN MATERIAL FOR PATTERN TRANSFER AND MAGNETIC RECORDING MEDIUM MANUFACTURING METHOD USING THE SAME

CROSS-REFERENCE TO RELATED APPLICATIONS

This application is based upon and claims the benefit of priority from Japanese Patent Application No. 2009-200860, filed Aug. 31, 2009; the entire contents of which are incorporated herein by reference.

FIELD

Embodiments described herein relate generally to a method of manufacturing a magnetic recording medium having discrete tracks on the surface of a magnetic recording layer and, more particularly, to an ultraviolet-curable resin material to be used as a resist when transferring a discrete track shape.

BACKGROUND

Recently, the nano-imprinting techniques are attracting attention in various fields in order to further increase the density and accuracy.

For example, applications to semiconductors, optical elements, magnetic recording media, and the like are being examined.

A discrete track medium is attracting attention among other magnetic recording media. In this discrete track medium, magnetic interference between adjacent recording tracks is reduced by separating the adjacent tracks by grooves or guard bands consisting of a nonmagnetic material, in order to further increase the density.

When manufacturing this discrete track medium, discrete track patterns of a magnetic layer can be formed by applying the nano-imprinting technique by using a stamper. When magnetic layer patterns corresponding to servo area signals are formed together with recording track patterns by imprinting, it is possible to obviate the servo track writing step required in the manufacture of the conventional magnetic recording media. This leads to a cost reduction as well.

As the process of forming discrete track patterns as described above, it is possible to use, e.g., a manufacturing process of transferring resist patterns from an Ni stamper by high-pressure imprinting or thermal imprinting as disclosed in, e.g., Jpn. Pat. Appln. KOKAI Publication No. 2007-186570. Unfortunately, this process is unsuitable for mass-production because the life of the Ni stamper is short. Also, when the data density is increased to make tracks finer, resist patterns cannot be well transferred.

From the foregoing, the use of optical nano-imprinting is attracting attention as another nano-imprinting technique.

To transfer patterns onto a resist on a discrete track medium by using optical nano-imprinting, a resin stamper is first duplicated from an Ni stamper (mother stamper) by injection molding, and bonded in a vacuum to an uncured ultraviolet-curable resin layer to be used as a resist. This method is found to be able to reduce the cost and suitable for micropatterning.

The characteristics required of the ultraviolet-curable resin for transfer onto the above-mentioned discrete track medium are the resistance against etching for processing transferred patterns, in addition to the property of coating onto the medium, the viscosity, the curing property, the property of separation from the resin stamper, and the cure shrinkage.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIGS. 1A, 1B, 1C and 1D are views showing a pattern transfer method to be used in the embodiment;

DETAILED DESCRIPTION

Figure 2:
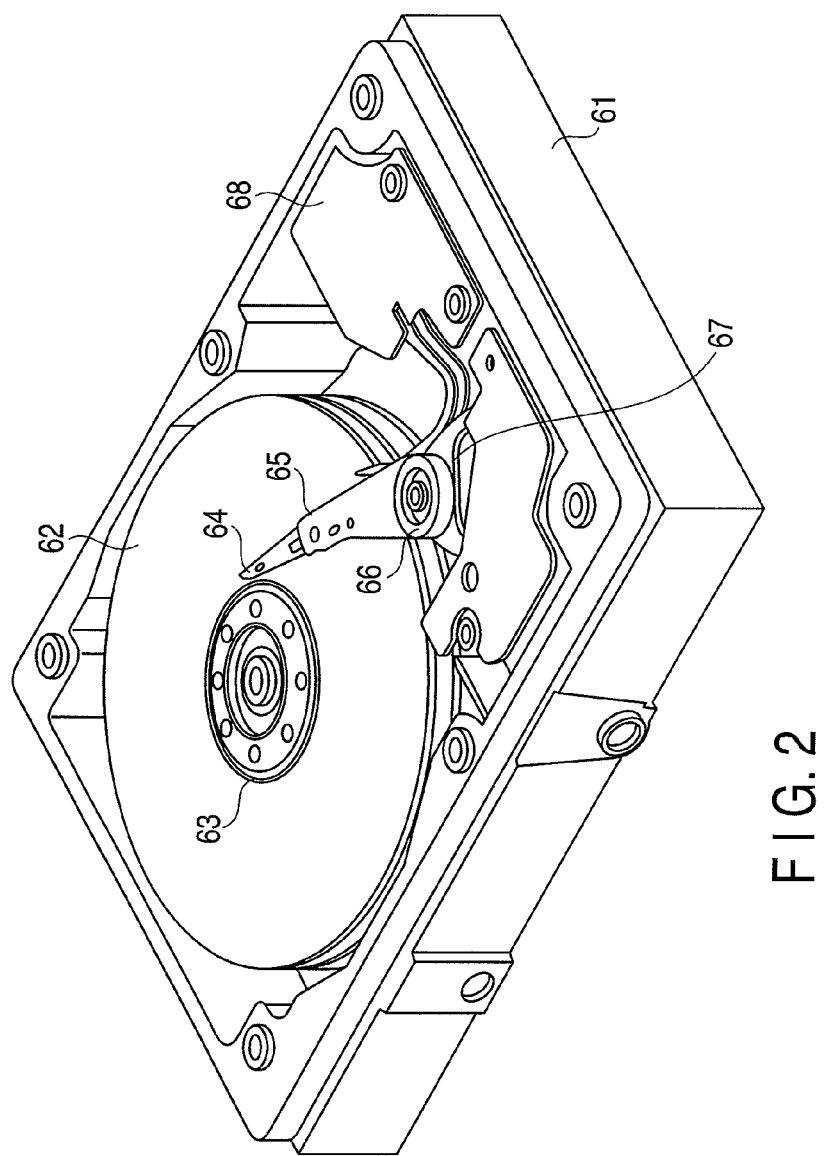
FIG. 2 is a view showing a magnetic recording/reproduction apparatus for performing recording and reproduction with respect to a magnetic recording medium.

Various embodiments will be described hereinafter with reference to the accompanying drawings.

In general, according to one embodiment, an ultraviolet-curable resin material for pattern transfer is provided, which contains an acrylate having a fluorene skeleton represented by formula (1) below, isobornyl acrylate represented by formula (2) below, a polyfunctional acrylate, and a polymerization initiator.

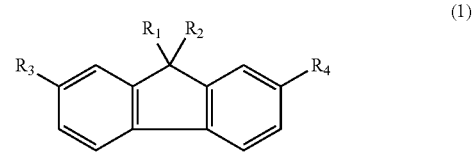

(1)

wherein each of $R_1$ and $R_2$ is one of —H, —OCOCH=$CH_2$,
—$CH_2$—OCOCH=$CH_2$,   —$C_2H_4$—OCOCH=$CH_2$,
—$C_3H_6$—OCOCH=$CH_2$, and
—$CH_4H_8$—OCOCH=$CH_2$.

It is possible to substitute, e.g.,

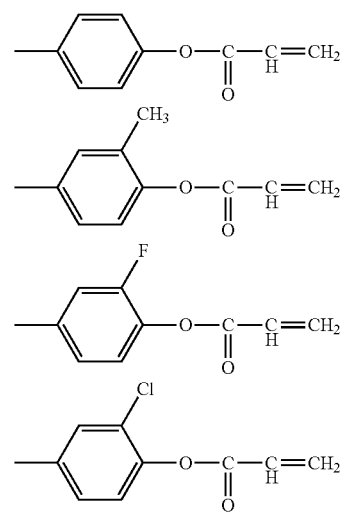

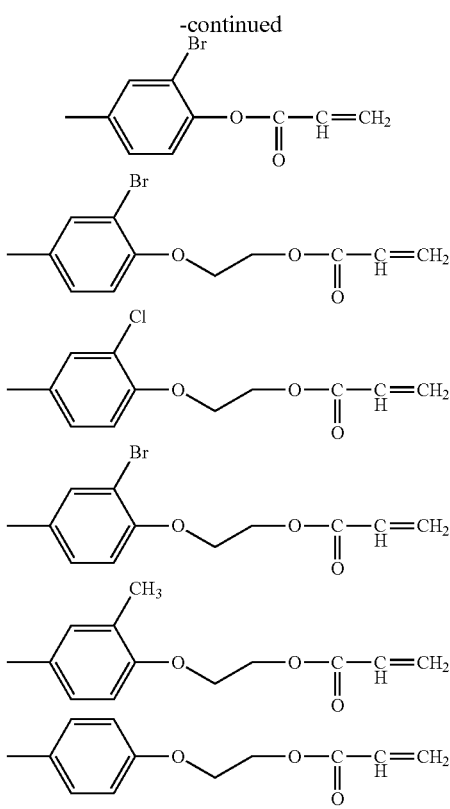

Also, R$_3$ and R$_4$ can be substituted with, e.g., H, —CH$_3$, —C$_2$H$_5$, —C$_3$H$_7$, —C$_4$H$_9$, —Cl, —F, —Br, —NH$_2$, —OH, or —OCOCH=CH$_2$.

In particular, 9,9'-bisphenylfluorene acrylate, 9,9'-bisphenylfluorene EO-modified acrylate, or 9,9'-bis(3-methylphenyl)fluorene acrylate has a higher etching resistance.

The embodiment uses the ultraviolet-curable resin material for pattern transfer containing the acrylate having a fluorene skeleton, isobornyl acrylate, the polyfunctional acrylate, and the polymerization initiator, and hence can increase the etching resistance without deteriorating the ultraviolet curing property and the property of separation after curing. When using this ultraviolet-curable resin material for pattern transfer, therefore, patterns can accurately be transferred from a stamper.

Use of an acrylate having a fluorene skeleton can improve the etching resistance.

Also, isobornyl acrylate has a relatively low viscosity of 9 CP and a relatively high glass transition point Tg. In addition, isobornyl acrylate has a high etching resistance because it has an alicyclic structure. When using a material containing two components, i.e., isobornyl acrylate and the polymerization initiator as the ultraviolet-curable resin material for pattern transfer, the hardness of the cured film was insufficient. The hardness of the cured film was insufficient even when a monofunctional monomer, a bifunctional monomer, and isobornyl acrylate were combined. When a trifunctional monomer was combined, the hardness of the cured film was sufficient while the etching resistance remained high. A polyfunctional monomer having an order higher than that of a trifunctional monomer often increases the viscosity.

Furthermore, isobornyl acrylate has a high etching resistance because it has an alicyclic structure and a high glass transition temperature Tg. However, the property of separation from a resin stamper often deteriorates because, e.g., the hardness of the cured film readily increases, and the surface tension is not high.

A magnetic recording medium manufacturing method according to one embodiment is a method including bonding, in a vacuum, the surface of a magnetic recording layer of a magnetic recording medium including a data area and a servo area, and a three-dimensional pattern surface of a resin stamper, with a coating layer of an uncured ultraviolet-curable resin material for pattern transfer being interposed between the surface of the magnetic recording layer and the three-dimensional pattern surface, curing the coating layer of the uncured ultraviolet-curable resin material by irradiating the coating layer with ultraviolet light, separating the resin stamper to form, on one surface of the magnetic recording medium, a cured ultraviolet-curable resin material layer onto which a three-dimensional pattern is transferred, and performing dry etching by using the cured ultraviolet-curable resin material layer as a mask, thereby forming a three-dimensional pattern on the surface of the magnetic recording layer, wherein the ultraviolet-curable resin material for pattern transfer contains an acrylate having a fluorene skeleton, isobornyl acrylate, a polyfunctional acrylate, and a polymerization initiator.

In addition to the acrylates and polymerization initiator described above, an additive such as an adhesive can be mixed in an amount of 3 wt % or less in the ultraviolet-curable resin material for pattern transfer of the embodiment as needed.

The ultraviolet-curable resin material for pattern transfer of the present invention can have a viscosity of 9 to 15 cp at 25° C.

When using an ultraviolet-curable resin material consisting of a monomer, oligomer, and polymerization initiator and containing no solvent, the groove width increases after dry etching because the etching rate of Ar milling in the dry etching is high. This makes it difficult to form fine grooves.

Also, an oligomer having a large molecular weight is presumably the cause of the decrease in dry etching resistance.

As the ultraviolet-curable resin material according to the embodiment, therefore, the use of an ultraviolet-curable resin material consisting of a plurality of predetermined types of monomers and a polymerization initiator and containing neither an oligomer nor a solvent has been examined.

Furthermore, the ultraviolet-curable resin material according to the embodiment is a radical polymerization-based material, and an acrylate is used in the embodiment because a photopolymerization reaction slows down when the monomer is a methacrylate.

The content of isobornyl acrylate is 10 to 62 wt %, that of the acrylate having a fluorene skeleton is 10 to 50 wt %, that of the polyfunctional acrylate is 10 to 44 wt %, and that of the polymerization initiator is 0.1 to 6 wt %.

The ultraviolet-curable resin having these contents further improves in viscosity, separation property, curing property, coating film thickness, and etching rate.

The polyfunctional acrylate usable in the embodiment includes a bifunctional acrylate, a trifunctional acrylate, and tetrafunctional and higher-order-functional acrylates.

Examples of the bifunctional acrylate are
1,3-butylene glycol diacrylate,
1,4-butanediol diacrylate,
diethylene glycol diacrylate,
1,6-hexanediol diacrylate,
neopentyl glycol diacrylate, polyethylene glycol (200) diacrylate,
tetraethylene glycol diacrylate,
triethylene glycol diacrylate,
tripropylene glycol diacrylate,
polyethylene glycol (400) diacrylate,
ethoxylated (3) bisphenol A diacrylate,
cyclohexane dimethanol diacrylate,
dipropylene glycol diacrylate,
acrylate ester (dioxane glycol diacrylate),
alkoxylated hexanediol diacrylate,
alkoxylated cyclohexane dimethanol diacrylate,
ethoxylated (4) bisphenol A diacrylate,
ethoxylated (10) bisphenol A diacrylate,
polyethylene glycol (600) diacrylate,
tricyclodecane dimethanol diacrylate,
propoxylated (2) neopentyl glycol diacrylate,
ethoxylated (30) bisphenol A diacrylate, and
alkoxylated neopentyl glycol diacrylate.

As the trifunctional acrylate, it is possible to use, e.g.,
trimethylolpropane triacrylate,
trimethylolpropane PO-modified triacrylate
(the number of POs (propoxy groups): 2, 3, 4, 6),
trimethylolpropane EO-modified triacrylate
(the number of EOs (ethoxy groups): 3, 6, 9, 15, 20),
tris(2-hydroxyethyl)isocyanurate triacrylate,
pentaerythritol triacrylate,
pentaerythritol EO-modified triacrylate,
EO-modified glycerin triacrylate,
propoxylated (3) glyceryl triacrylate,
highly propoxylated (5.5) glyceryl triacrylate,
trisacryloyloxyethyl phosphate, and
ε-caprolactone-modified tris(acryloxyethyl)isocyanurate.

As the tetrafunctional and higher-order-functional acrylates, it is possible to use, e.g.,
trisacryloyloxyethyl phosphate,
pentaerythritol tetraacrylate,
ditrimethylolpropane tetraacrylate,
ethoxylated (4) pentaerythritol tetraacrylate, and
dipentaerythritol pentaacrylate.

It is also possible to use a polyfunctional oligomer.
Examples of the oligomer are a urethane acrylate oligomer, epoxy acrylate oligomer, and polyester acrylate oligomer. Although any of these oligomers is usable, an acrylate oligomer containing an aromatic group is particularly favorable in respect of the etching resistance. An aromatic urethane acrylate oligomer is most particularly favorable in respect of the separation property, etching resistance, and compatibility. The oligomer may also contain Si or F, and an oligomer containing Si is particularly suitable because it functions as a release agent as well.

An acrylate having an adamantane skeleton can further be added to the ultraviolet-curable resin material according to the embodiment.

Examples of the acrylate having an adamantane skeleton usable in the embodiment are
2-methyl-2-adamantyl acrylate,
2-ethyl-2-adamantyl acrylate,
3-hydroxy-1-adamantyl acrylate,
1-adamantyl acrylate,
2-methyl-2-adamantyl methacrylate,
2-ethyl-2-adamantyl methacrylate,
3-hydroxy-1-adamantyl methacrylate,
1-admantyl methacrylate,
1,3-adamantane diol diacrylate, and
1,3-adamantane dimethanol diacrylate.
In particular,
2-methyl-2-adamantyl acrylate,
2-ethyl-2-adamantyl acrylate, and
1-adamantyl acrylate
are favorable.

The content of the acrylate having an adamantane skeleton in the ultraviolet-curable resin material for pattern transfer of the embodiment is 0 to 40 wt %.

Examples of the polymerization initiator usable in the embodiment are an alkylphenone-based photopolymerization initiator, acylphosphine oxide-based polymerization initiator, titanocene-based polymerization initiator, oxime ester-based photopolymerization initiator, and oxime ester acetate-based photopolymerization initiator.

Practical examples of the above-mentioned polymerization initiators are
2,2-dimethoxy-1,2-diphenylethane-1-on (IRGACURE651 manufactured by Ciba Specialty Chemicals),
1-hydroxy-cyclohexyl-phenyl-ketone (IRGACURE184 manufactured by Ciba Specialty Chemicals), and
2-hydroxy-2-methyl-1-phenyl-propane-1-on
(DAROCUR1173 manufactured by Ciba Specialty Chemicals).

Other examples are IRGACURE2959, IRGACURE127, IRGACURE907, IRGACURE369, IRGACURE379, DAROCUR TPO, IRGACURE819, IRGACURE784, IRGACURE OXE01, IRGACURE OXE02, and IRGACURE754 (all are manufactured by Ciba Specialty Chemicals).

It is possible to select an optimum polymerization initiator in accordance with the wavelength of a lamp for use in UV irradiation.

As the lamp for use in UV irradiation, it is possible to use, e.g., a high-pressure mercury lamp, metal halide lamp, or xenon flash lamp.

An outline of a pattern transfer method to be used in the embodiment will be explained below with reference to FIGS. 1A to 1D.

FIGS. 1A to 1D illustrate the transfer of patterns onto one surface of a medium substrate. As shown in FIG. 1A, a medium substrate 51 is set on a spinner 41. As shown in FIG. 1B, while the medium substrate 51 is spun together with the spinner 41, the ultraviolet-curable resin (2P resin) according to the embodiment is dropped from a dispenser 42 and spin-coated. As shown in FIG. 1C, in a vacuum chamber 81, one surface of the magnetic recording medium 51 and the pattern surface of a transparent stamper 71 are bonded in a vacuum with the 2P resin layer (not shown) being interposed between them. As shown in FIG. 1D, the 2P resin layer is cured by emitting UV light from a UV light source 43 through the transparent stamper 71 at atmospheric pressure. After the step shown in FIG. 1D, the transparent stamper 71 is separated.

Examples of a magnetic disk substrate usable in the embodiment are a glass substrate, an Al-based alloy substrate, a ceramic substrate, a carbon substrate, an Si single-crystal substrate having an oxidized surface, and a substrate obtained by forming an NiP layer on the surface of any of these substrates. As the glass substrate, amorphous glass or crystallized glass can be used. Examples of the amorphous glass are soda lime glass and alumino silicate glass. An example of the crystallized glass is lithium-based crystallized glass. As the ceramic substrate, it is possible to use a sintered product mainly containing aluminum oxide, aluminum nitride, or silicon nitride, or a material formed by fiber-reinforcing the sintered product. Plating or sputtering is used to form the NiP layer on the substrate surface.

When manufacturing a perpendicular magnetic recording medium, a so-called perpendicular double-layered medium can be formed by forming a perpendicular magnetic recording layer on a soft magnetic underlayer (SUL) on a substrate.

The soft magnetic underlayer of the perpendicular double-layered medium passes a recording magnetic field from a recording magnetic pole, and returns the recording magnetic field to a return yoke placed near the recording magnetic pole. That is, the soft magnetic underlayer performs a part of the function of a recording head; the soft magnetic underlayer applies a steep perpendicular magnetic field to the recording layer, thereby increasing the recording efficiency.

An example of the soft magnetic underlayer usable in the embodiment is a high-k material containing at least one of Fe, Ni, and Co. Examples of the material are FeCo-based alloys such as FeCo and FeCoV, FeNi-based alloys such as FeNi, FeNiMo, FeNiCr, and FeNiSi, FeAl-based and FeSi-based alloys such as FeAl, FeAlSi, FeAlSiCr, FeAlSiTiRu, and FeAlO, FeTa-based alloys such as FeTa, FeTaC, and FeTaN, and FeZr-based alloys such as FeZrN.

As the soft magnetic underlayer, it is also possible to use a material having a microcrystal structure such as FeAlO, FeMgO, FeTaN, or FeZrN containing 60 at % or more of Fe, or a material having a granular structure in which fine crystal grains are dispersed in a matrix.

As another material of the soft magnetic underlayer, it is possible to use a Co alloy containing Co and at least one of Zr, Hf, Nb, Ta, Ti, and Y. The content of Co can be 80 at % or more. An amorphous layer is readily formed when a film of the Co alloy is formed by sputtering. The amorphous soft magnetic material has none of magnetocrystalline anisotropy, a crystal defect, and a grain boundary, and hence has superb soft magnetism. It is also possible to reduce the noise of the medium by using the amorphous soft magnetic material. Favorable examples of the amorphous soft magnetic material are CoZr-based, CoZrNb-based, and CoZrTa-based alloys.

Another underlayer may also be formed below the soft magnetic underlayer in order to improve the crystallinity of the soft magnetic underlayer or improve the adhesion to the substrate. As the underlayer material, it is possible to use Ti, Ta, W, Cr, Pt, an alloy containing any of these materials, or an oxide or nitride of any of these materials.

An interlayer consisting of a nonmagnetic material can be formed between the soft magnetic underlayer and the perpendicular magnetic recording layer. The interlayer interrupts the exchange coupling interaction between the soft magnetic underlayer and the recording layer, and controls the crystallinity of the recording layer. As the interlayer material, it is possible to use Ru, Pt, Pd, W, Ti, Ta, Cr, Si, an alloy containing any of these materials, or an oxide or nitride of any of these materials.

To prevent spike noise, it is possible to divide the soft magnetic underlayer into a plurality of layers, and antiferromagnetically couple these layers with 0.5- to 1.5-nm-thick Ru films being sandwiched between them. Also, the soft magnetic layer can be coupled by exchange coupling with a hard magnetic film having in-plane anisotropy such as CoCrPt, SmCo, or FePt, or a pinning layer consisting of an antiferromagnetic material such as IrMn or PtMn. To control the exchange coupling force, a magnetic layer such as a Co layer or a nonmagnetic layer such as a Pt layer can be stacked above and below the Ru layer.

As the perpendicular magnetic recording layer usable in the embodiment, it is possible to use, e.g., a material mainly containing Co, containing at least Pt, containing Cr as needed, and further containing an oxide (e.g., silicon oxide or titanium oxide). In this perpendicular magnetic recording layer, the magnetic crystal grains can form a pillar structure. In the perpendicular magnetic recording layer having this structure, the orientation and crystallinity of the magnetic crystal grains are favorable. As a consequence, a signal-to-noise ratio (SNR) suitable for high-density recording can be obtained. The amount of oxide is important to obtain the above structure. The content of the oxide can be 3 to 12 mol %, and can also be 5 to 10 mol %, with respect to the total amount of Co, Pt, and Cr. When the content of the oxide in the perpendicular magnetic recording layer falls within the above range, the oxide deposits around the magnetic grains, so the magnetic grains can be isolated and reduced in size. If the content of the oxide exceeds the above range, the oxide remains in the magnetic grains and deteriorates the orientation and crystallinity of the magnetic grains. Furthermore, the oxide deposits above and below the magnetic grains. Consequently, the pillar structure in which the magnetic grains extend vertically through the perpendicular magnetic recording layer is often not formed. On the other hand, if the content of the oxide is less than the above range, the magnetic grains are insufficiently isolated and reduced in size. As a result, noise increases during recording and reproduction, and this often makes it impossible to obtain a signal-to-noise ratio (SNR) suited to high-density recording.

The content of Pt in the perpendicular magnetic recording layer can be 10 to 25 at %. When the Pt content falls within the above range, a uniaxial magnetic anisotropy constant Ku necessary for the perpendicular magnetic recording layer is obtained. In addition, the crystallinity and orientation of the magnetic grains improve. Consequently, a thermal decay characteristic and recording/reproduction characteristic suited to high-density recording are obtained. If the Pt content exceeds the above range, a layer having the fcc structure is formed in the magnetic grains, and the crystallinity and orientation may deteriorate. On the other hand, if the Pt content is less than the above range, it is often impossible to obtain Ku, i.e., a thermal decay characteristic suitable for high-density recording.

The content of Cr in the perpendicular magnetic recording layer can be 0 to 16 at %, and can also be 10 to 14 at %. When the Cr content falls within the above range, it is possible to maintain high magnetization without decreasing the uniaxial magnetic anisotropy constant Ku of the magnetic grains. Consequently, a recording/reproduction characteristic suited to high-density recording and a sufficient thermal decay characteristic are obtained. If the Cr content exceeds the above range, the thermal decay characteristic worsens because Ku of the magnetic grains decreases. In addition, the crystallinity and orientation of the magnetic grains worsen. As a consequence, the recording/reproduction characteristic tends to worsen.

The perpendicular magnetic recording layer can contain one or more additive elements selected from B, Ta, Mo, Cu, Nd, W, Nb, Sm, Tb, Ru, and Re, in addition to Co, Pt, Cr, and the oxide. These additive elements can promote the reduction in size of the magnetic grains, or improve the crystallinity and orientation of the magnetic grains. This makes it possible to obtain a recording/reproduction characteristic and thermal decay characteristic more suitable for high-density recording. The total content of these additive elements can be 8 at % or less. If the total content exceeds 8 at %, a phase other than the hcp phase is formed in the magnetic grains, and this disturbs the crystallinity and orientation of the magnetic grains. As a result, it is often impossible to obtain a recording/reproduction characteristic and thermal decay characteristic suited to high-density recording.

Other examples of the material of the perpendicular magnetic recording layer are a CoPt-based alloy, a CoCr-based alloy, a CoPtCr-based alloy, CoPtO, CoPtCrO, CoPtSi, and CoPtCrSi. As the perpendicular magnetic recording layer, it is also possible to use a multilayered film containing Co and an alloy mainly containing at least one element selected from the group consisting of Pt, Pd, Rh, and Ru. It is further possible to use a multilayered film such as CoCr/PtCr, CoB/PdB, or CoO/RhO obtained by adding Cr, B, or O to each layer of the above-mentioned multilayered film.

The thickness of the perpendicular magnetic recording layer can be 5 to 60 nm, and can also be 10 to 40 nm. A perpendicular magnetic recording layer having a thickness falling within this range is suited to a high recording density. If the thickness of the perpendicular magnetic recording layer is less than 5 nm, the reproduction output becomes too low, so the noise component often becomes higher than the reproduction output. On the other hand, if the thickness of the perpendicular magnetic recording layer exceeds 40 nm, the reproduction output becomes too high and tends to distort the waveform. The coercive force of the perpendicular magnetic recording layer can be 237,000 A/m (3,000 Oe) or more. If the coercive force is less than 237,000 A/m (3,000 Oe), the thermal decay resistance tends to decrease. The perpendicular squareness ratio of the perpendicular magnetic recording layer can be 0.8 or more. If the perpendicular squareness ratio is less than 0.8, the thermal decay resistance often decreases.

A protective layer can be formed on the perpendicular magnetic recording layer.

The protective layer prevents the corrosion of the perpendicular magnetic recording layer, and also prevents damages to the medium surface when a magnetic head comes in contact with the medium. Examples of the material of the protective layer are materials containing C, $SiO_2$, and $ZrO_2$. The thickness of the protective layer can be 1 to 10 nm. When the thickness of the protective layer falls within the above range, the distance between the head and the medium can be decreased. This is suitable for high-density recording.

The surface of the perpendicular magnetic recording medium can be coated with a lubricant, e.g., perfluoropolyether, alcohol fluoride, or fluorinated carboxylic acid.

FIG. 2 is a view showing a magnetic recording/reproduction apparatus for performing recording and reproduction with respect to the magnetic recording medium.

This magnetic recording apparatus includes, in a housing 61, a magnetic recording medium 62, a spindle motor 63 for rotating the magnetic recording medium 62, a head slider 64 including a recording/reproduction head, a head suspension assembly (a suspension 65 and actuator arm 66) for supporting the head slider 64, a voice coil motor 67, and a circuit board.

The magnetic recording medium 62 is attached to and rotated by the spindle motor 63, and various kinds of digital data are recorded by the perpendicular magnetic recording method. The magnetic head incorporated into the head slider 64 is a so-called composite head, and includes a write head having a single-pole structure and a read head using a GMR or TMR film. The suspension 65 is held at one end of the actuator arm 66, and supports the head slider 64 so as to oppose it to the recording surface of the magnetic recording medium 62. The actuator arm 66 is attached to a pivot 68. The voice coil motor 67 is formed as an actuator at the other end of the actuator arm 64. The voice coil motor 67 drives the head suspension assembly to position the magnetic head in an arbitrary radial position of the magnetic recording medium 62. The circuit board includes a head IC, and generates, e.g., a voice coil motor driving signal, and control signals for controlling read and write by the magnetic head.

An address signal and the like can be reproduced from the processed magnetic recording medium by using this magnetic disk apparatus.

A magnetic disk in which the track density was 325 kTPI [Track Per Inch, equivalent to a track pitch of 78 nm] in a data zone having a radius of 9 to 22 mm was manufactured by using the method of the embodiment.

To manufacture the magnetic disk having a servo area as described above, imprinting is performed using a stamper having three-dimensional patterns corresponding to magnetic layer patterns on the magnetic disk. Note that the surface of the three-dimensional patterns of the magnetic layer formed by imprinting and subsequent processing may also be planarized by burying a nonmagnetic material in recesses.

A method of manufacturing the magnetic disk of this embodiment will be explained below.

First, a stamper was manufactured.

An Si wafer having a diameter of 6 inches was prepared as a substrate of a master as a template of the stamper. On the other hand, resist ZEP-520A available from ZEON was diluted to ½ with anisole, and the solution was filtered through a 0.05-μm filter. The Si wafer was spin-coated with the resist solution and prebaked at 200° C. for 3 min, thereby forming a resist layer about 50 nm thick.

An electron beam lithography system having a ZrO/W thermal-field-emission electron gun emitter was used to directly write desired patterns on the resist on the Si wafer at an acceleration voltage of 50 kV. This lithography was performed using a signal source that synchronously generates signals for forming servo patterns, burst patterns, address patterns, and track patterns, signals to be supplied to a stage driving system (a so-called X-θ stage driving system including a moving mechanism having a moving axis in at least one direction and a rotating mechanism) of the lithography system, and an electron beam deflection control signal. During the lithography, the stage was rotated at a CLV (Constant Linear Velocity) of 500 mm/s, and moved in the radial direction as well. Also, concentric track areas were written by deflecting the electron beam for every rotation. Note that the feeding speed was 7.8 nm per rotation, and one track (equivalent to one address bit width) was formed by ten rotations.

The resist was developed by dipping the Si wafer in ZED-N50 (available from ZEON) for 90 seconds. After that, the Si wafer was rinsed as it was dipped in ZMD-B (available from ZEON) for 90 seconds, and dried by air blow, thereby manufacturing a resist master (not shown).

A conductive film of Ni was formed on the resist master by sputtering. More specifically, pure nickel was used as a target, and, after a chamber was evacuated to $8 \times 10^{-3}$ Pa, the pressure was adjusted to 1 Pa by supplying gaseous argon, and sputtering was performed in the chamber for 40 seconds by applying a DC power of 400 W, thereby depositing a conductive film about 10 nm thick.

The resist master having this conductive film was dipped in a nickel sulfamate plating solution (NS-160 available from Showa Chemical Industry), and Ni electroforming was performed for 90 min, thereby forming an electroformed film about 300 μm thick. The electroforming bath conditions were as follows.

Electroforming Bath Conditions
Nickel sulfamate: 600 g/L
Boric acid: 40 g/L
Surfactant (sodium lauryl sulfate): 0.15 g/L
Solution temperature: 55° C.
pH: 4.0
Current density: 20 A/dm$^2$ The electroformed film and conductive film were separated together with the resist residue from the resist master. The resist residue was removed by oxygen plasma ashing. More specifically, plasma ashing was performed for 20 min by applying a power of 100 W in a chamber in which the pressure was adjusted to 4 Pa by supplying gaseous oxygen at 100 mL/min.

Figure 3:
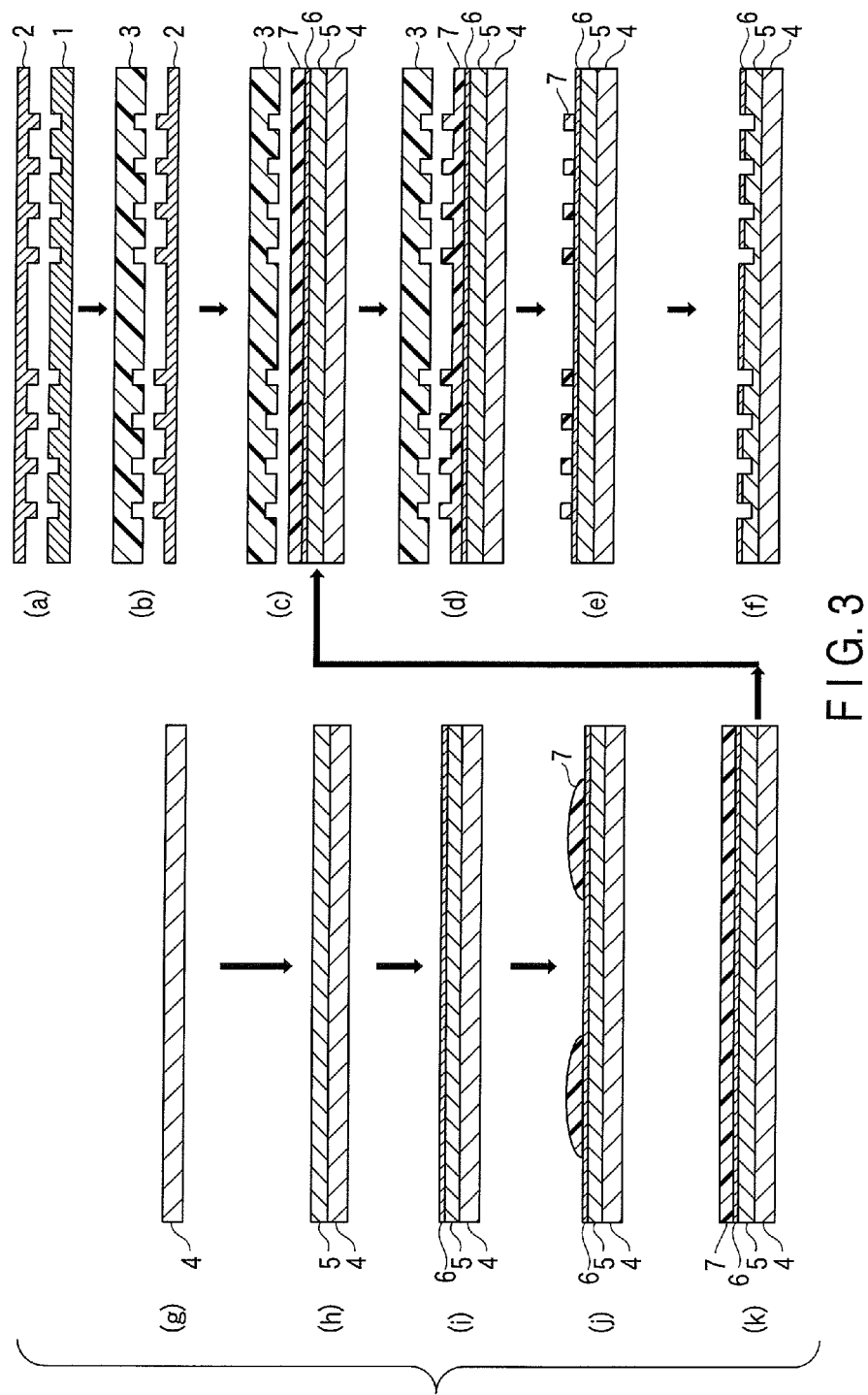
FIG. 3 is a view showing an embodiment of a discrete magnetic recording medium manufacturing method.

A father stamper 1 including the conductive film and electroformed film as described above was obtained. After that, as shown in FIG. 3(*a*), electroforming was further performed to duplicate a mother stamper 2. An injection molding stamper was obtained by removing unnecessary portions of the mother stamper 2 by a metal blade.

As shown in FIG. 3(*b*), a resin stamper 3 was duplicated from the mother stamper 2 by using an injection molding apparatus manufactured by TOSHIBA MACHINE. As the molding material, cyclic olefin polymer ZEONOR 1060R available from ZEON was used. However, polycarbonate material AD5503 available from TEIJIN CHEMICALS may also be used.

Then, a magnetic disk was manufactured.

A magnetic recording layer 5 was formed by sputtering on a disk substrate made of doughnut-like glass 1.8 inches in diameter as shown in FIG. 3(*g*) and FIG. 3(*h*). A 3-nm-thick metal mask layer 6 was stacked on this magnetic recording layer as shown in FIG. 3(*i*). Examples of a metal usable as the metal mask layer are Ag, Al, Au, C, Cr, Cu, Ni, Pt, Pd, Ru, Si, Ta, Ti, Zn, and alloys (e.g., CrTi, CoB, CoPt, CoZrNb, NiTa, NiW, Cr—N, SiC, and $TiO_x$) containing these metals. In particular, Si and Cu are superior in property of separation from a resin stamper and processability to other metals. The film thickness of the metal mask layer is determined by the processability, and further as small as possible. In this embodiment, a 3-nm-thick Cu layer was stacked on the magnetic recording layer.

After a surface protection layer 6 was formed on a magnetic recording layer 5 as shown in FIG. 3(*i*), a resist 7 consisting of an ultraviolet-curable resin material was diluted to 3 wt % by 2,2,3,3-tetrafluoro-1-propanol, and the solution was spin-coated at a rotational speed of 10,000 rpm as shown in FIG. 3(*j*) and FIG. 3(*k*).

As shown in FIG. 3(*c*), the resin stamper 3 was bonded to the ultraviolet-curable resin resist 7 on the surface of the disk substrate by vacuum bonding, and the resin was cured by ultraviolet irradiation. After that, the resin stamper 3 was separated as shown in FIG. 3(*d*).

In a three-dimensional pattern formation process performed by ultraviolet imprinting, the resist residue remains on the bottoms of pattern recesses.

Then, the resist residue on the bottoms of pattern recesses was removed by RIE using gaseous oxygen. As shown in FIG. 3(*e*), the magnetic recording layer was etched by Ar ion milling. Subsequently, as shown in FIG. 3(*f*), the resist patterns were removed by oxygen RIE. In addition, a carbon protective layer (not shown) was deposited on the entire surface. After that, the manufactured magnetic disk was coated with a lubricant.

In the magnetic disk medium described above, the magnetic recording layer was etched to the bottom in a portion where no resist mask was formed. However, it is also possible to stop Ar ion milling halfway to obtain a medium having projections and recesses. Alternatively, it is possible to obtain a medium by imprinting a stamper onto a resist on a substrate without initially forming any magnetic layer, making the substrate shape three-dimensional in advance by etching or the like, and then forming a magnetic film. Furthermore, in any medium including the above-mentioned media, the grooves may also be filled with a certain nonmagnetic material.

Although the ultraviolet-curable resin was diluted to 3 wt % by 2,2,3,3,-tetrafluoro-1-propanol, the ultraviolet-curable resin can also be used without being diluted depending on the viscosity and coating method of the resin. As the solvent for dilution, it is also possible to use, e.g., anisole, isopropyl alcohol, ethanol, acetone, cyclic hydrofluorocarbon (e.g., ZEORORA H available from ZEON), or cyclic hydrofluoroether.

Example

The embodiment will be explained in more detail below by way of its example.

A resin stamper was duplicated by the above-mentioned method by using one Ni stamper, and resist mask transfer was performed using an ultraviolet-curable resin.

The ultraviolet-curable resin was evaluated for five items, i.e., the curing property, separation property, coating property, transfer property, and Ar sputter etching rate.

The curing property was evaluated after transfer by wiping up the resin with cloth wetted by ethanol. The evaluation was ○ when there was no change, Δ when there were fine scratches, and x when the wiped portion entirely peeled off.

The separation property was evaluated as ○ when no 2P resin remained on the resin stamper after separation, Δ when the 2P resin slightly remained, and x when the 2P resin remained in a wide area.

The coating property was evaluated by visually observing the surface of the ultraviolet-curable resin after transfer. The evaluation was ○ when the color was uniform, Δ when the color was slightly nonuniform, and x when the color was largely nonuniform as if phase separation occurred.

The transfer property was evaluated by observing the transferred patterns on the ultraviolet-curable resin with an AFM. The evaluation was ○ when the groove depth remained unchanged from that of the resin stamper, Δ when the groove depth varied, and x when the groove depth changed (decreased).

The Ar sputter etching rate was measured by performing plasma etching in an Ar ambient at a pressure of 1 Pa and an RF power of 100 W for 200 seconds by using 51A manufactured by Shibaura Mechatronics. Before and after the etching, the film thickness of the ultraviolet-curable resin was measured by using Dektak 6M Stylus Surface Profiler manufactured by Ulvac. The etching rate was calculated by normalizing the difference between the film thicknesses before and after the etching by the etching time. As the etching resistance increases, the processability when using the ultraviolet-curable resin improves, so the etching rate can be decreased. For example, an etching rate of 0.15 nm/s or less can be used as a reference.

Although a transfer pattern sample by which the ratio of the land to the groove was 1:1 was used in the above example, the embodiment is not limited to this. The characteristics of the apparatus for checking the RRO characteristic make tracking impossible to perform if PP/SUM as a value obtained by normalizing an amplitude (p-p) of a push-pull signal PP by a voltage value (p-G) of a sum signal SUM satisfies at least PP/SUM<0.1. Accordingly, it is possible to select a land-to-groove ratio at which tracking can be performed by preventing this.

Example

Magnetic recording media were manufactured by transferring patterns onto magnetic recording layers by the above-mentioned method by using ultraviolet-curable resin samples A to V.

Tables 1 and 2 show the contents of ultraviolet-curable resin samples A to Z, and Tables 3 and 4 show the results.

Symbols used in Tables 1 and 2 will be explained below.

IBOA: Isobornyl acrylate

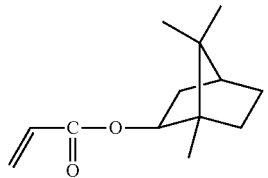

MADA: 2-methyl-2-adamantyl acrylate

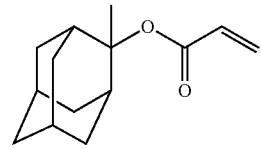

TMPTA: Trimethylolpropane triacrylate

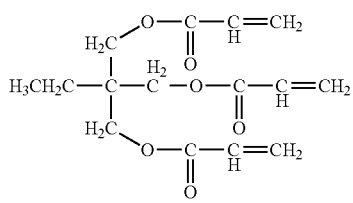

Fluorene skeleton acrylate I: 9,9′-bisphenylfluorene EO-modified acrylate

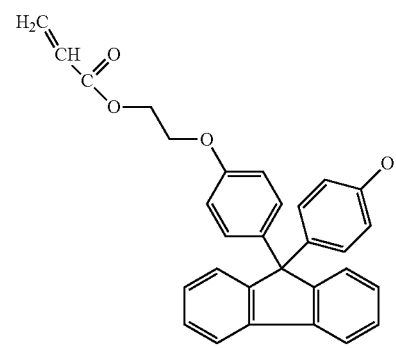

Fluorene skeleton acrylate II:

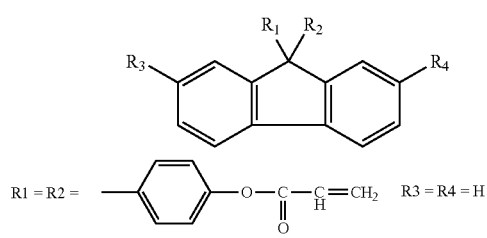

$R1 = R2 = $ ![structure] $R3 = R4 = H$     (1)

Fluorene skeleton acrylate III:

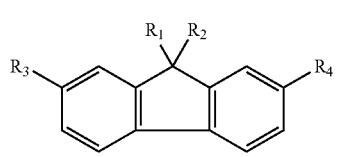

(1)

$R1 = R2 = $ ![structure] $R3 = R4 = H$     (2)

TMPTA-3EO: Ethoxylated (3) tetramethylolpropane triacrylate

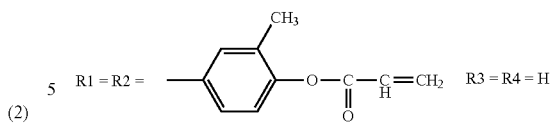

(6)

wherein $l + m + n = 3$

DTMPTA: Ditrimethylolpropane tetraacrylate

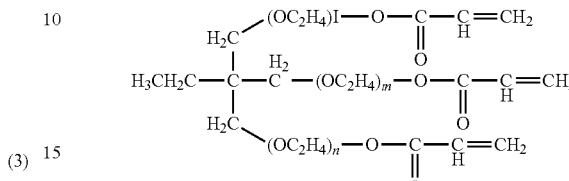

(7)

GPTA: Propoxylated (3) glyceryl triacrylate

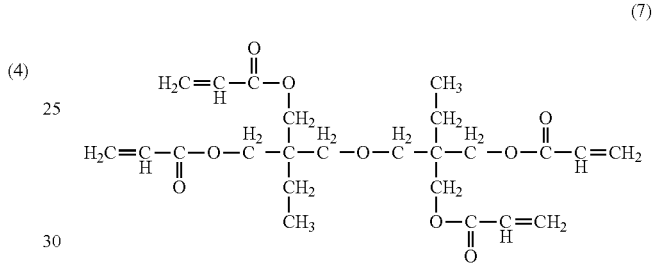

$x + y + z = 3$

PE(EO)TTA: Ethoxylated (4) pentaerythritol tetraacrylate

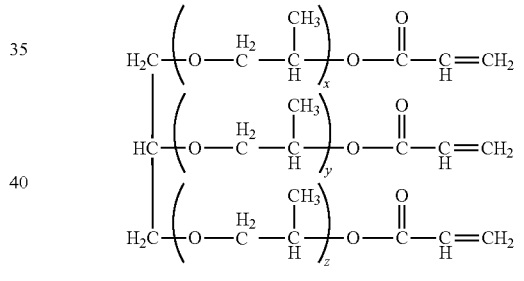

(9)

HDDA: 1,6-hexandiol diacrylate

AGDA: Acetal glycol diacrylate

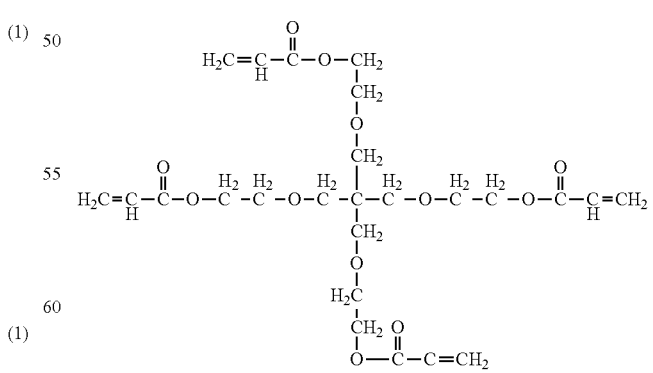

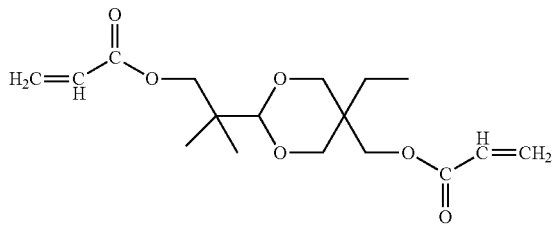

(10)

IRGACURE369: Polymerization initiator manufactured by Ciba Specialty Chemicals

DAROCUR1173: Polymerization initiator manufactured by Ciba Specialty Chemicals

PU370: Trifunctional aromatic urethane acrylate oligomer manufactured by MIWON

SIU2400: 10-functional Si acrylate oligomer manufactured by MIWON

Ultraviolet-curable resin samples B, C, D, F, H, I, J, K, L, M, N, R, U, V, W, and X were found to be ultraviolet-curable resins suitably usable for the purpose of transferring patterns onto a magnetic recording medium in respect of all of the curing property, separation property, coating property, transfer property, and etching rate.

By contrast, samples A, O, Q, S, and Y were inferior in etching resistance because the etching rate was high. The content of IBOA of sample A was smaller than that of sample B. This example shows that the content of IBOA can be 10% or more. Sample O demonstrates that the etching resistance further decreased when no IBOA was contained. Sample Q inferior in etching resistance indicates that the fluorene skeleton acrylate has a large influence on the etching resistance and is a material necessary to increase the etching resistance. Sample S shows that the etching resistance tends to decrease when the content of the polymerization initiator exceeds 6%. The etching rate increases and the etching resistance decreases especially when there is neither MADA nor the fluorene skeleton acrylate and the ratio of the polyfunctional acrylate is high.

Samples E, G, P, and S were inferior in separation property and transfer property. Samples E, G, and H reveal that the content of the polyfunctional acrylate can be 10% or more. Sample P shows that problems arise in separation property and transfer property when there is no IBOA. IBOA was found to be an acrylate required for mask pattern transfer.

Samples O and P were inferior in coating property. The material was seemingly separated in the coating film probably because the ultraviolet-curable resin contained no IBOA.

The following processing was performed on samples Q, Y, J, and W. That is, after the patterns were transferred onto the ultraviolet-curable resin, RIE using gaseous oxygen was performed to remove the resist residue from the bottoms of the pattern recesses. Then, the metal mask layers (Cu) in the portions (the bottoms of the pattern recesses) from which the resist was removed were removed by Ar ion milling at a gas pressure of 0.1 Pa for an etching time of 15 seconds. After that, the carbon protective layer was removed by RIE using gaseous oxygen, thereby exposing the surface of the magnetic recording layer. The mask shapes were measured with an AFM in this state. Consequently, the mask shapes of samples Q and Y deformed, but samples J and W maintained the rectangularity of the masks and were able to form micropatterns having a groove width of about 5 nm. This reveals that when the ultraviolet-curable resin contains the fluorene skeleton acrylate and adamantane skeleton acrylate, the mask shape is maintained even when the magnetic material is processed, and desired patterns and micropatterns can be processed.

On the other hand, the surface of the magnetic recording layer of each of samples Q, Y, J, and W was exposed by removing the carbon protective layer by RIE using gaseous oxygen following the same procedures as above, except that gaseous $CF_4$ milling, instead of Ar ion milling, was performed at a gas pressure of 0.1 Pa for an etching time of 15 seconds to remove the mask layers (Si) from the portions (the bottoms of the pattern recesses) from which the resist was removed. The mask shapes were measured with an AFM in this state. Consequently, the rectangularity of the masks was maintained, and it was possible to form micropatterns having a groove width of about 5 nm. That is, samples J and W according to the embodiment were able to form good mask shapes regardless of whether Ar ion milling or gaseous $CF_4$ milling was used. However, samples Q and Y containing no fluorene skeleton acrylate were able to form good mask shapes when using gaseous $CF_4$ milling, but unable to form good mask shapes when using Ar ion milling. Recently, the use of gaseous $CF_4$ is declining greatly with a view to protecting the environment. Samples Q and Y containing no fluorene skeleton acrylate were found to have the environmental problem. In addition, when processing not only the front side but also the back side of a disk, it is very difficult to apply reactive ion etching using gaseous $CF_4$ because discharge is unstable. A double-sided disk can be processed by Ar ion milling or Ar sputter etching.

Furthermore, it was possible to obtain favorable characteristics when forming DTR media by using good ultraviolet-curable resin samples B, C, D, F, H, I, J, K, L, M, N, R, U, V, W, and X, and checking the recording/reproduction characteristics.

Note that although Irgacure 369 or Darocur 1173 was used as the polymerization initiator in this example, it is naturally possible to appropriately select any polymerization initiator in accordance with the affinity to the UV lamp or acrylate.

TABLE 1

| Ultraviolet-curable resin | IBOA | MADA | Fluorene skeleton acrylate | Polyfunctional acrylate | Polymerization initiator |
|---|---|---|---|---|---|
| A | 9.4 wt % | 0 wt % | I45.0 wt % | TMPTA 45.1 wt % | IRGACURE369 0.5 wt % |
| B | 11.0 wt % | 0 wt % | I44.9 wt % | TMPTA 43.6 wt % | IRGACURE369 0.5 wt % |
| C | 44.0 wt % | 0 wt % | I31.0 wt % | TMPTA 24.5 wt % | IRGACURE369 0.5 wt % |
| D | 56.4 wt % | 0 wt % | II18.8 wt % | TMPTA 24.1 wt % | IRGACURE369 0.7 wt % |
| E | 69.2 wt % | 0 wt % | I25.4 wt % | TMPTA 4.4 wt % | IRGACURE369 0.9 wt % |
| F | 61.3 wt % | 0 wt % | I17.2 wt % | TMPTA 20.5 wt % | IRGACURE369 1.0 wt % |
| G | 56.3 wt % | 0 wt % | I38.0 wt % | TMPTA 5.1 wt % | IRGACURE369 0.6 wt % |
| H | 51.3 wt % | 0 wt % | I37.3 wt % | TMPTA 10.8 wt % | IRGACURE369 0.6 wt % |

TABLE 1-continued

| Ultraviolet-curable resin | IBOA | MADA | Fluorene skeleton acrylate | Polyfunctional acrylate | Polymerization initiator |
|---|---|---|---|---|---|
| I | 27.9 wt % | 21.9 wt % | I25.1 wt % | TMPTA-3EO 24.7 wt % | IRGACURE369 0.5 wt % |
| J | 26.1 wt % | 21.1 wt % | I22.8 wt % | TMPTA 29.5 wt % | IRGACURE369 0.5 wt % |
| K | 10.8 wt % | 38.6 wt % | I25.2 wt % | TMPTA 24.9 wt % | IRGACURE369 0.6 wt % |
| L | 29.8 wt % | 26.2 wt % | I29.1 wt % | DTMPTA 14.3 wt % | IRGACURE369 0.5 wt % |
| M | 27.8 wt % | 22.1 wt % | I25.5 wt % | GPTA 24.1 wt % | IRGACURE369 0.5 wt % |
| N | 27.8 wt % | 22.1 wt % | I24.8 wt % | PE(EO)TTA 24.8 wt % | IRGACURE369 0.5 wt % |

TABLE 2

| Ultraviolet-curable resin | IBOA | MADA | Fluorene skeleton acrylate | Polyfunctional acrylate | Polymerization initiator |
|---|---|---|---|---|---|
| O | 0 wt % | 0 wt % | I37.3 wt % | HDDA 51.3 wt %/TMPTA 10.8 wt % | IRGACURE369 0.6 wt % |
| P | 0 wt % | 56.4 wt % | I18.8 wt % | TMPTA 24.1 wt % | IRGACURE369 0.7 wt % |
| Q | 30.2 wt % | 29.6 wt % | I0 wt % | TMPTA 39.2 wt % | IRGACURE369 1.0 wt % |
| R | 24.1 wt % | 20.1 wt % | I22.0 wt % | TMPTA 27.8 wt % | DARCUR1173 6.0 wt % |
| S | 24.0 wt % | 19.9 wt % | I22.0 wt % | TMPTA 27.6 wt % | DARCUR1173 6.5 wt % |
| T | 26.2 wt % | 21.2 wt % | I22.9 wt % | TMPTA 29.7 wt % | 0 wt % |
| U | 21.5 wt % | 21.9 wt % | I25.9 wt % | TMPTA 13.1 wt %/AGDA 16.9 wt % | IRGACURE369 0.7 wt % |
| V | 56.5 wt % | 0 wt % | III18.8 wt % | TMPTA 24.0 wt % | IRGACURE369 0.7 wt % |
| W | 27.4 wt % | 21.9 wt % | I24.9 wt % | PU370 25.3 wt % | IRGACURE369 0.7 wt % |
| X | 27.7 wt % | 22.1 wt % | I25.4 wt % | SIU2400 24.3 wt % | IRGACURE369 0.7 wt % |
| Y | 30.0 wt % | 0 wt % | 0 wt % | TMPTA 69.0 wt % | IRGACURE369 1.0 wt % |

TABLE 3

| Ultraviolet-curable resin | Curing property | Separation property | Coating property | Transfer property | Etching rate (nm/s) | |
|---|---|---|---|---|---|---|
| A | ○ | ○ | ○ | ○ | 0.154 | X |
| B | ○ | ○ | ○ | ○ | 0.148 | ○ |
| C | ○ | ○ | ○ | ○ | 0.123 | ○ |
| D | ○ | ○ | ○ | ○ | 0.129 | ○ |
| E | ○ | X | ○ | X | 0.084 | ○ |
| F | ○ | ○ | ○ | ○ | 0.141 | ○ |
| G | ○ | Δ | ○ | Δ | 0.077 | ○ |
| H | ○ | ○ | ○ | ○ | 0.086 | ○ |
| I | ○ | ○ | ○ | ○ | 0.149 | ○ |
| J | ○ | ○ | ○ | ○ | 0.148 | ○ |
| K | ○ | ○ | ○ | ○ | 0.129 | ○ |
| L | ○ | ○ | ○ | ○ | 0.099 | ○ |
| M | ○ | ○ | ○ | ○ | 0.144 | ○ |
| N | ○ | ○ | ○ | ○ | 0.147 | ○ |

TABLE 4

| Ultraviolet-curable resin | Curing property | Separation property | Coating property | Transfer property | Etching rate (nm/s) | |
|---|---|---|---|---|---|---|
| O | ○ | ○ | X | ○ | 0.169 | X |
| P | ○ | Δ | Δ | Δ | 0.13 | ○ |
| Q | ○ | ○ | ○ | ○ | 0.18 | X |
| R | ○ | ○ | ○ | ○ | 0.149 | ○ |
| S | ○ | Δ | ○ | ○ | 0.156 | X |
| T | X | X | X | X | Immeasurable | |
| U | ○ | ○ | ○ | ○ | 0.128 | ○ |
| V | ○ | ○ | ○ | ○ | 0.131 | ○ |
| W | ○ | ○ | ○ | ○ | 0.149 | ○ |
| X | ○ | ○ | ○ | ○ | 0.139 | ○ |
| Y | ○ | ○ | ○ | ○ | 0.215 | X |

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An ultraviolet-curable resin material for pattern transfer comprising isobornyl acrylate, an acrylate having a fluorene skeleton represented by formula (1), a polyfunctional acrylate, and a polymerization initiator,

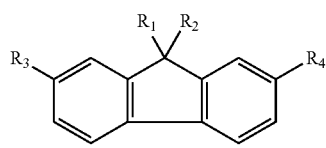

(1)

wherein each of $R_1$ and $R_2$ is selected from the group consisting of H, $-C_2H_4-OCOCH=CH_2$, $-C_3H_6-OCOCH=CH_2$, $-CH_4H_8-OCOCH=CH_2$,

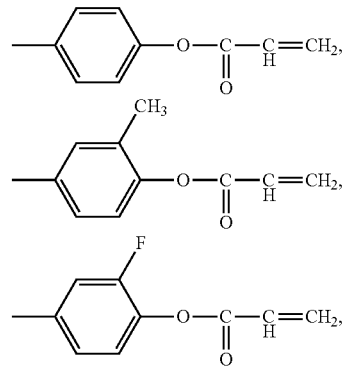

-continued

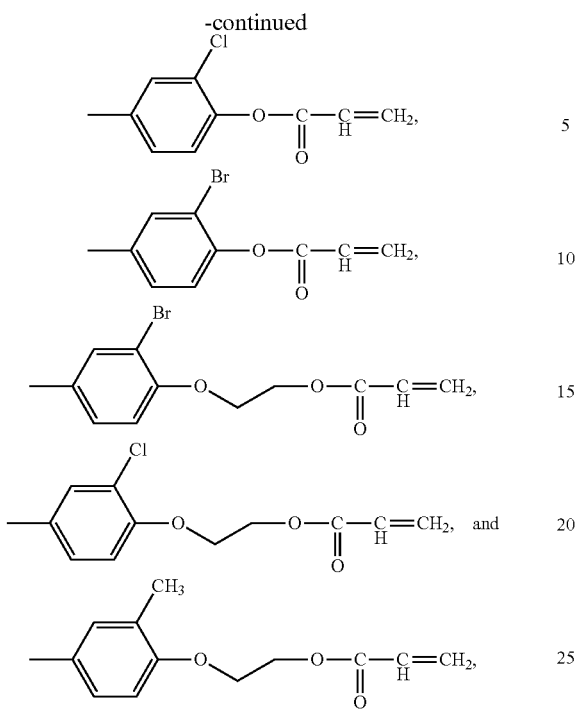

and each of $R_3$ and $R_4$ is selected from the group consisting of H, —$CH_3$, —$C_2H_5$, —$C_3H_7$, —$C_4H_9$, —Cl, —F, —Br, —$NH_2$, —OH, and —OCOCH=$CH_2$.

2. The material of claim 1, wherein
isobornyl acrylate is present in a weight percent between about 10 and 62,
the acrylate having a fluorene skeleton is present in a weight percent between about 10 and 50,
the polyfunctional acrylate is present in a weight percent between about 10 and 44, and
the polymerization initiator is present in a weight percent between about 0.1 and 6.

3. An ultraviolet-curable resin material for pattern transfer comprising isobornyl acrylate, an acrylate having a fluorene skeleton represented by formula (1), a polyfunctional acrylate, an acrylate having an adamantane skeleton, and a polymerization initiator,

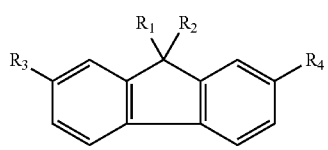

(1)

wherein each of $R_1$ and $R_2$ is selected from the group consisting of H, —$C_2H_4$—OCOCH=$CH_2$, —$C_3H_6$—OCOCH=$CH_2$, —$CH_4H_8$—OCOCH=$CH_2$,

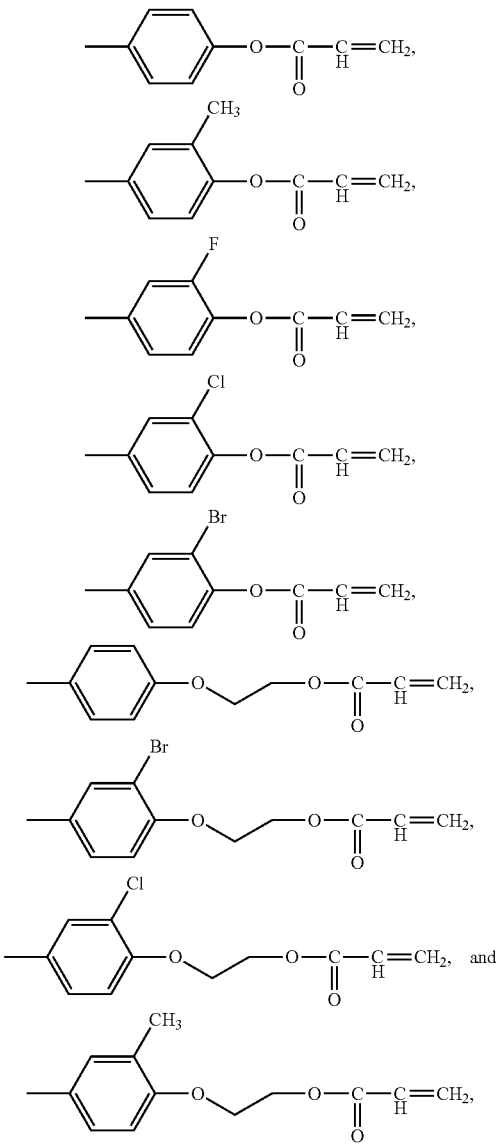

and each of $R_3$ and $R_4$ is selected from the group consisting of H, —$CH_3$, —$C_2H_5$, —$C_3H_7$, —$C_4H_9$, —Cl, —F, —Br, —$NH_2$, —OH, and —OCOCH=$CH_2$.

4. The material of claim 3, wherein the acrylate having an adamantane skeleton is present in a weight percent between about 0 and 40.

5. The material of claim 1, wherein the acrylate having a fluorene skeleton is selected from the group consisting of 9,9'-bisphenylfluorene acrylate, 9,9'-bisphenylfluorene EO-modified acrylate, and 9,9'-bis(3-ethylphenyl)fluorene acrylate.

* * * * *